United States Patent
Steele et al.

(10) Patent No.: US 6,486,742 B1
(45) Date of Patent: Nov. 26, 2002

(54) BLIND COHERENT COMBINER AND METHOD USING COUPLED PHASE-LOCK LOOPS

(75) Inventors: Greg Steele, Fremont, CA (US); Eric Fain, Santa Clara, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/950,129

(22) Filed: Sep. 10, 2001

(51) Int. Cl.[7] ................................................ H03L 7/00
(52) U.S. Cl. ...................... 331/11; 331/1 A; 375/376; 375/327
(58) Field of Search ........................... 331/1 A; 375/11, 375/12, 22, 46, 327, 376

(56) References Cited

U.S. PATENT DOCUMENTS

| | | | | |
|---|---|---|---|---|
| 5,440,267 A | * | 8/1995 | Tsuda et al. | 329/308 |
| 5,579,345 A | * | 11/1996 | Kroeger et al. | 375/261 |
| 5,712,595 A | * | 1/1998 | Yokoyama | 331/2 |
| 5,828,705 A | * | 10/1998 | Kroeger et al. | 375/316 |
| 6,154,483 A | * | 11/2000 | Davidovici et al. | 370/336 |
| 6,240,556 B1 | * | 5/2001 | Evans et al. | 455/71 |

* cited by examiner

Primary Examiner—Terry D. Cunningham
Assistant Examiner—Quan Tra
(74) Attorney, Agent, or Firm—Kenneth W. Float

(57) ABSTRACT

Coherent combining apparatus and methods that do not require training to adapt combining weights. The approach employed in the present invention uses phase-lock loops to demodulate input signals. The phase-lock loops are coupled so that their outputs are phase coherent. The outputs of the phase-lock loops are summed to obtain a coherent combining of the input signals. Exemplary embodiments of the present invention comprise two or more phase-lock loops having signal inputs and I and Q data outputs. A combiner sums the I and Q data output by the two or more phase-lock loops. A common decision circuit feeds back the summed output of the combiner to the two or more phase-lock loops and generates phase coherent output signals.

5 Claims, 2 Drawing Sheets

BLIND COHERENT COMBINER AND METHOD USING COUPLED PHASE-LOCK LOOPS

BACKGROUND

The present invention relates generally to combiners, and more particularly, to a blind coherent combiner and signal processing method employing coupled phase-lock loops.

The operation of coherently combining of multiple copies of a signal has many applications in communications systems. Beam-forming and diversity combining are two examples. Most adaptive algorithms used to obtain the combining weights require knowledge of the desired signal (i.e., a training sequence). This is discussed by Robert Monzingo and Thomas Miller in "Introduction to Adaptive Arrays", Wiley Interscience, 1980, for example.

However, in many applications, the use of training sequences is undesirable or impossible. Conventional blind beamforming schemes have been proposed in the literature. This is discussed by Theodore Rappaport, in "Smart Antennas: Adaptive Arrays, Algorithms, & Wireless Location", IEEE, 1998. Such conventional blind beamforming schemes tend to be computationally involved.

It is therefore an objective of the present invention to provide for a blind coherent combiner and signal processing method employing coupled phase-lock loops that overcomes limitations of conventional blind beamforning schemes.

SUMMARY OF THE INVENTION

To accomplish the above and other objectives, the present invention provides for a simple coherent combining scheme that does not require training to adapt the combining weights. The approach employed in the present invention uses phase-lock loops to demodulate input signals. The phase-lock loops are coupled so that their outputs are phase coherent. The outputs of the phase-lock loops are summed to obtain a coherent combining of the input signals. This approach is also advantageous in that it introduces little additional hardware into receivers that may employ it. This combining scheme may be implemented in either an analog or all-digital implementation.

Exemplary apparatus comprises two or more phase-lock loops having signal inputs and I and Q (in-phase and quadrature) data outputs. A combiner sums the I and Q data output by the two or more phase-lock loops. A common decision circuit feeds back the summed output of the combiner to the two or more phase-lock loops and that outputs phase-coherent output signals from the apparatus.

The signal processing method is used to couple two or more phase-lock loops that each output I and Q data to produce a phase coherent output signal. The method comprises the following steps. The I and Q data output by the two or more phase-lock loops are summed. The summed I and Q data are processed using a common decision circuit to generate a phase-coherent output signal. The summed I and Q data are fed back to the two or more phase-lock loops.

The present invention provides for coherent combining of digital communications signals. The approach of the present invention utilizes a novel coupling of phase-lock loops. This approach is simple, requires little additional hardware or processing, and operates without the use of training sequences.

BRIEF DESCRIPTION OF THE DRAWINGS

The various features and advantages of the present invention may be more readily understood with reference to the following detailed description taken in conjunction with the accompanying drawings, wherein like reference numerals designate like structural element, and in which.

DETAILED DESCRIPTION

Figure 1:
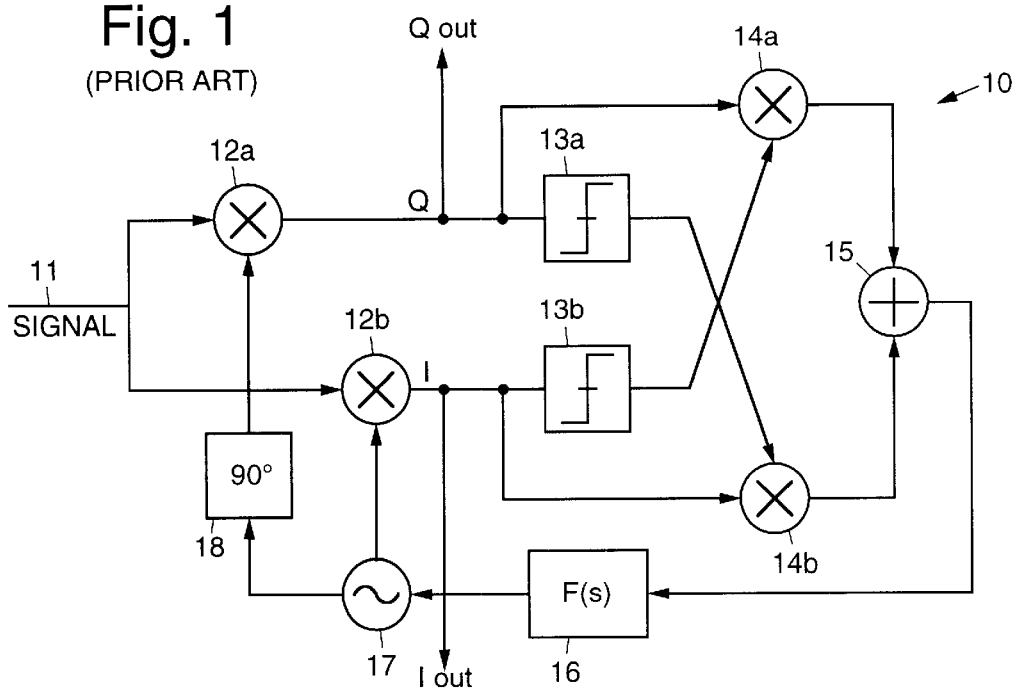
FIG. 1 illustrates a conventional four-phase Costas loop.

Referring to the drawing figures, FIG. 1 illustrates a: conventional four-phase Costas phase-lock loop 10. The conventional four-phase Costas loop 10 has an input 11 that receives an input signal. The input signal is applied to first inputs of first I and Q multipliers 12a, 12b. The outputs of the first I and Q multipliers 12a, 12b provide I and Q output signals, respectively.

The I and Q output signals are input to a decision circuit 13 comprising I and Q decision devices 13a, 13b and to first inputs of second I and Q multipliers 14a, 14b. Outputs of the second I and Q multipliers 14a, 14b are input to second inputs of the second I and Q multipliers 14a, 14b. Outputs of the second I and Q multipliers 14a, 14b are combined in a summing device 15.

The combined signal output by the summing device 15 is filtered by a loop filter, (F(s)) 16. The output,of the loop filter 16 is input to a VCO (voltage-controlled oscillator) for analog implementation, NCO (numerically controlled oscillator) in a digital implementation 17. A first output of the VCO 17 is coupled to a second input of the first I multiplier 12a. A second out Doff the VCO 17 is coupled by way of a 90 degree phase Shifter 18 and coupled to a second input of the first Q multiplier 12b.

Now, consider the objective of combining two copies of a QPSK signal. The copies will have phase differences and potentially, frequency offsets. If a four-phase Costas loop 10, such as is shown in FIG. 1, is used to process each signal, the Costas loop 10 will (if properly designed) acquire the frequency and phase of each signal and output demodulated I-Q data.

Unfortunately, the outputs of the two Costas loops 10 cannot simply be added to obtain a coherent summing of the signals. There is a $\pi/2$ phase ambiguity associated with, the demodulation of QPSK signals. Thus, the outputs of the two Costas loops 10 in this, example may not be phase aligned.

To overcome this difficulty, the present invention provides for a simple scheme to couple the operation of the two phase-lock loops 10 in such a way that their outputs are phase coherent. It should be noted that the phase-lock loops 10 are typically standard components of coherent digital communications systems. The only additional hardware that is required to implement the present invention is coupling hardware used to couple signals between the two phase-lock loops 10.

Then conventional four-phase Costas loop 10 shown in FIG. 1 is used to demodulate QPSK signals. The phase-lock loop 10 has stable lock points for phase errors of $\{0, \pi/2, \pi, 3\pi/2\}$. This is where the phase-ambiguity in the output arises. If the output of two independent phase-lock loops 10 are combined, they could lock on two different lock points, and thus their outputs would not be phase coherent.

Figure 2:
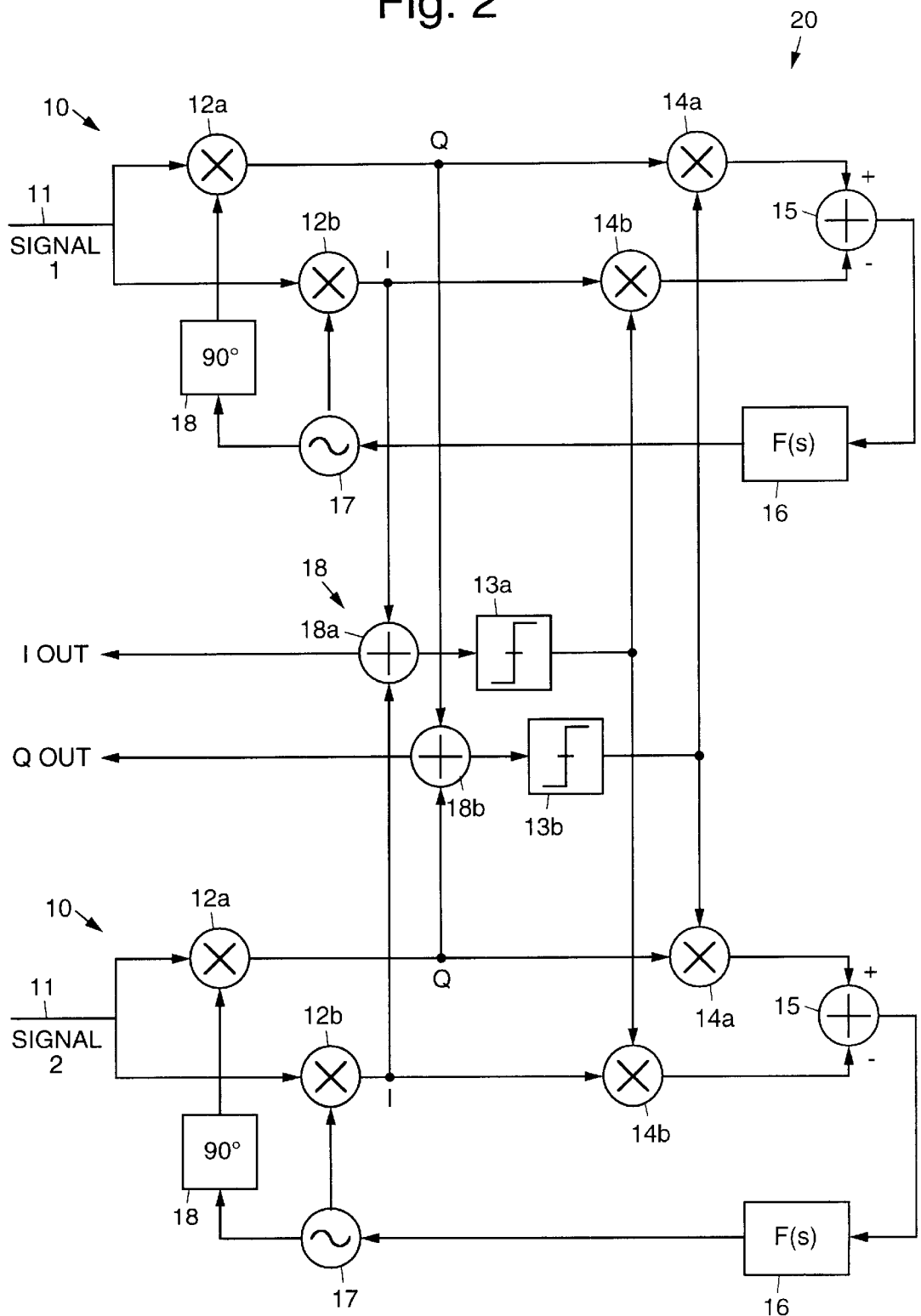
FIG. 2 illustrates an exemplary blind coherent combiner in accordance with the principles of the present invention that uses coupled phase-lock loops.

On the other hand, consider the diagram shown in FIG. 2. FIG. 2 shows a system 20, or blind coherent combiner 20, in accordance with the present invention. The exemplary blind coherent combiner 20 comprise two coupled phase-lock loops 10. The two phase-lock loops 10 are substantially the same as the conventional phase-lock loops 10 described with reference to FIG. 1. However, the phase-lock loops 10 are coupled together in accordance with the principles of the present invention in a manner such that their outputs are phase coherent.

The coupling occurs through a common decision circuit 13 comprising I and Q decision circuits 13a, 13b. The common decision circuit eliminates any 180 degree differences on the I signal pairs and Q signal pairs, thereby eliminating any 90 degree differences between input signal 1 and input signal 2. The phase-corrected I and Q data from each loop 10 are summed in a combiner 18 comprising I and Q summing circuits 18a, 18b. The summed output of the combiner provides a phase-coherent output of the system 20, or blind coherent combiner 20. The combiner 18 is located prior to the common decision circuit 13. The output of the common decision circuit 13 is fed back to each phase-lock loop 10 for normal operation.

Thus, the implementation provided by the present invention is thus quite simple and requires little additional hardware. It should be clear to those skilled in the art that the coupling hardware may be generalized for multiple phase-lock loops 10 and different modulation schemes,-including high-order QAM.

A simple simulation was designed to illustrate the effect of this coupling on the operation of the phase-lock loops 10. The simulation included two first order phase-lock loops 10 coupled as described above with reference to FIG. 2. A pseudo-random data stream was constructed. Two pseudo-random phase errors were added to the stream to produce two copies of the original data.

Figure 3:
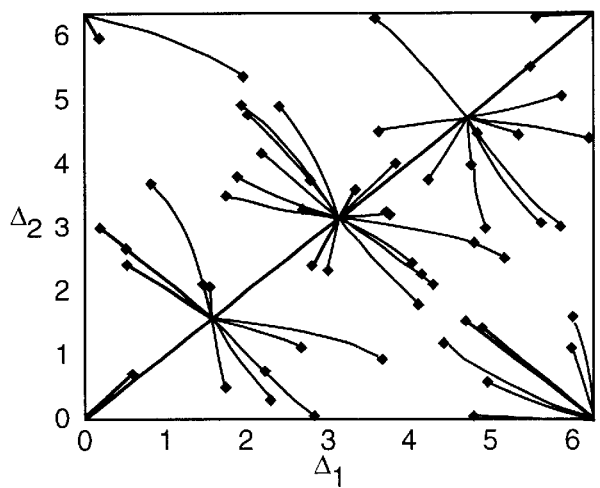
FIG. 3 illustrates dynamics of the phase error for the coupled phase-lock loops employed in the exemplary blind coherent combiner shown in FIG. 2.

The two data streams were fed into the combiner. FIG. 3 is a plot that displays the dynamics of the coupled phase-lock loops 10 for many initial conditions (initial phase error). The x-axis is the phase error for the phase-lock loop for signal 1 10, the y-axis is the phase error for the phase-lock loop for signal 2 10. The curves show the phase error trajectories over time as the combiner acquires the signals. As mentioned previously, when the two phase-lock loops 10 are uncoupled they can lock at the values $\{0, \pi/2, \pi, 3\pi/2\}$.

Note that for the coupled phase-lock loop system shown in FIG. 2, the stable lock points occur along the line $\Delta 1 = \Delta 2$ (modulo $2\pi$), i.e., when the two phase-lock loops 10 have the same phase error. This demonstrates that, in fact, the system comprising coupled phase-lock loops 10 in accordance with the present invention only locks onto points such that their outputs are phase coherent.

Figure 4:
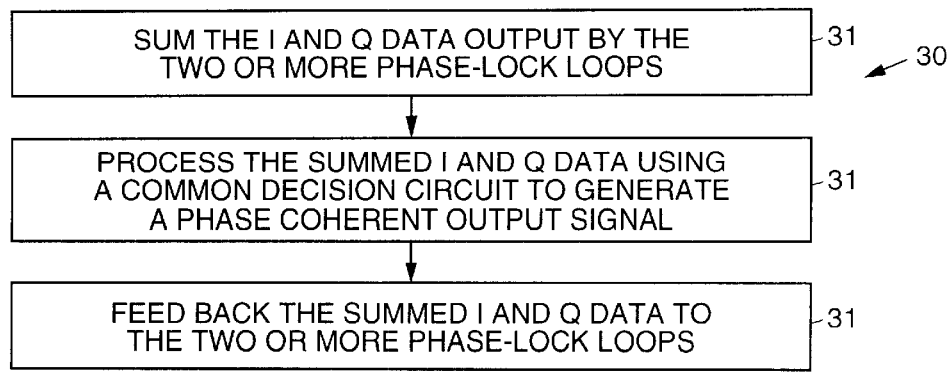
FIG. 4 is a flow diagram that illustrates an exemplary signal processing method in accordance with the principles of the present invention.

FIG. 4 is a flow diagram that illustrates an exemplary signal processing method 30 in accordance with the principles of the present invention. The exemplary method 30 couples two or more phase-lock loops that each output I and Q data to produce a phase-coherent output signal. The exemplary method 30 comprises the following steps.

The I and Q data output by the two or more phase-lock loops are summed 31. The summed I and Q data are processed 32 using a common decision circuit to generate a phase coherent output signal. The summed I and Q data are fed back 33 to the two or more phase-lock loops.

Thus, the present invention provides for a system and method that couples two or more phase-lock loops 10 so that their outputs are phase coherent. This system may be used as a simple blind coherent combining scheme. The system requires little additional hardware than would be required in two independent receiver chains.

Thus, blind coherent combining apparatus and methods have been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. Apparatus comprising:

first and second phase-lock loops having signal inputs and I and Q data outputs;

a combiner for summing the I and Q data output by the first and second phaselock loops; and a common decision circuit,that feeds back the summed output of the combiner to each phase-lock loop and that outputs phase coherent output signals from the apparatus.

2. The apparatus recited in claim 1 wherein the combiner comprises I and Q summing circuits.

3. Apparatus comprising:

two or more phase-lock loops having signal inputs and I and Q data outputs;

a combiner for summing the I and Q data output by the two or more phase-lock loops; and a common decision circuit 13 that feeds back the summed output of the combiner to the two or more phase-lock loops and that outputs phase coherent output signals from the apparatus.

4. The apparatus recited in claim 1 wherein the combiner comprises I and Q summing circuits.

5. A method for coupling two or more phase-lock loops that each output I and Q data to produce a phase coherent output signal, comprising the steps of:

summing the I and Q data output by the two or more phase-lock loops;

processing the summed I and Q data using a common decision circuit to generate a phase coherent output signal; and feeding back the summed I and Q data to the two or more phase-lock loops.

* * * * *